US 6,604,916 B2

(12) United States Patent
Lu et al.

(10) Patent No.: US 6,604,916 B2
(45) Date of Patent: Aug. 12, 2003

(54) HOT SWAP FAN TRAY

(75) Inventors: Chow-Wen Lu, Taoyuan Hsien (TW);
Te-Tsai Chuang, Miaoli Hsien (TW);
Chao-Wu Wen, Taoyuan Hsien (TW);
Wen-Shi Huang, Taoyuan Hsien (TW)

(73) Assignee: Deha Electronics, Inc., Taoyuan (TW)

( * ) Notice: Subject to any disclaimer, the term of this patent is extended or adjusted under 35 U.S.C. 154(b) by 28 days.

(21) Appl. No.: 09/924,531

(22) Filed: Aug. 9, 2001

(65) Prior Publication Data

US 2002/0048520 A1 Apr. 25, 2002

(30) Foreign Application Priority Data

Oct. 23, 2000 (TW) ........................ 89218412 U

(51) Int. Cl.[7] ............... F04B 17/00; F04B 35/00
(52) U.S. Cl. ........................ 417/360; 361/695
(58) Field of Search ................ 417/360; 361/727, 361/695; 370/380; 439/238

(56) References Cited

U.S. PATENT DOCUMENTS

| 5,398,161 | A | * | 3/1995 | Roy ........................... 361/727 |
| 5,788,467 | A | * | 8/1998 | Zenitani et al. .............. 417/360 |
| 6,234,817 | B1 | * | 5/2001 | Hwang ........................ 439/247 |
| 6,285,548 | B1 | * | 9/2001 | Hamlet et al. ............... 361/695 |
| 6,322,382 | B1 | * | 11/2001 | Viallet ........................ 439/238 |
| 6,392,893 | B1 | * | 5/2002 | Carney et al. .............. 361/727 |
| 6,426,952 | B1 | * | 7/2002 | Francis et al. .............. 370/380 |

* cited by examiner

Primary Examiner—Teresa Walberg
Assistant Examiner—Leonid M Fastovsky
(74) Attorney, Agent, or Firm—Birch, Stewart, Kolasch & Birch, LLP

(57) ABSTRACT

A hot swap fan tray which includes a tray and at least one fan. Among these, the tray includes at least one alignment post, at least one resilient fastener and one end of the connector. The fan includes an alignment hole and another end of the connector. After the alignment post slides into the alignment hole, the resilient fastener fastens the fan. Meanwhile, the end of the connector electrical contacts another end of the connector.

5 Claims, 2 Drawing Sheets

HOT SWAP FAN TRAY

BACKGROUND OF THE INVENTION

1. Field of the Invention

The present invention relates to a fan tray, and more particularly to a hot swap fan tray.

2. Description of the Prior Art

The so-called fan tray indicates the assemblage including a tray having a number of fans mounted thereon. Once some fan has a breakdown, the controller starts the redundant fan or accelerates the speed so as to compensate the decreased cooling ability.

As shown in FIG. 1, the conventional fan tray 10 includes a plurality of fans 20 and a tray 30. The tray 30 includes an opening 33, a bottom plate 35, four side walls and thus has the shape of an oblong box. The bottom plate 35 further includes a fan guard 37 formed thereon. The fan 20 is vertically mounted on the tray 30 through the opening 33. Besides, screws 50 attaching the fan 20 to the bottom plate 35 of the tray 30. During assembling, the conventional fan tray 10 is mounted to a heat-generating device (i.e. a server) in the manner that the opening 33 faces to the server and the fan guard 37 faces outward. Besides, each of the fans is connected to the controller 60 by means of electrical wire, such as the signal or the power line.

However, the conventional fan tray 10 suffers from the problem that it is not easy to mount and remove the fan 20. Especially, during disassembling, the problem is more serious. For example, the fan tray 10 is used to dissipate the heat from a server. Once some fan has a failure and is desired to replace, it is difficult to remove the broken fan from the tray. The user has to previously remove the entire fan tray 10 from server the server and subsequently replaces the broken fan. The reason is described in detail as follows. Since the broken fan is mounted on the tray 30 by screws and the fan guard 37 faces the user, the fan guard 37 obstructs the user to directly remove the broken fan 20 from the fan tray 10. The user has to previously remove the entire fan tray 10 and then turn and make the opening 33 face himself. After that, the user is able to remove the broken fan. Under the condition described above, there is not enough time to replace the broken fan.

Further, as shown in FIG. 1, each of the fans 20 is equipped with electrical wires 25 (i.e. the power line or the signal line) to connect the controller 60. However, the electrical wires 25 are exposed and thus disorder the heat-generating device.

Therefore, there is a need in the art for a novel fan tray having hot swap fan to solve the above-mentioned problems. Besides, it is preferred that the novel fan tray also prevents the electrical wires from disorder.

SUMMARY OF THE INVENTION

The present invention relates to a fan tray, and more particularly to a hot swap fan tray. The fan tray includes at least one fan, a tray and a controller. Among these, the tray includes at least one alignment post, at least one resilient fastener and one end of the connector. The fan includes an alignment hole and another end of the connector. After the alignment post slides into the alignment hole, the resilient fastener fastens the fan. Meanwhile, the end of the connector electrical contacts another end of the connector.

In sum, the resilient fastener and the alignment post make the fan align to and connect with the tray easy and quickly. That is, the present invention is capable of hot swap. In addition, the electrical contact from the fan to the controller is formed while the fan is mounted on the tray.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention relates to a fan tray having hot swap fan. The so-called hot swap means that the attachment and remove of any fan is quick and convenient. Besides, attaching or removing any fan to and from the fan tray do not affect the operation of the fan tray. Since the present invention is capable of hot swap, the influence on the heat-generating device, caused by attaching or removing fan, can be effectively reduced.

Figure 1:
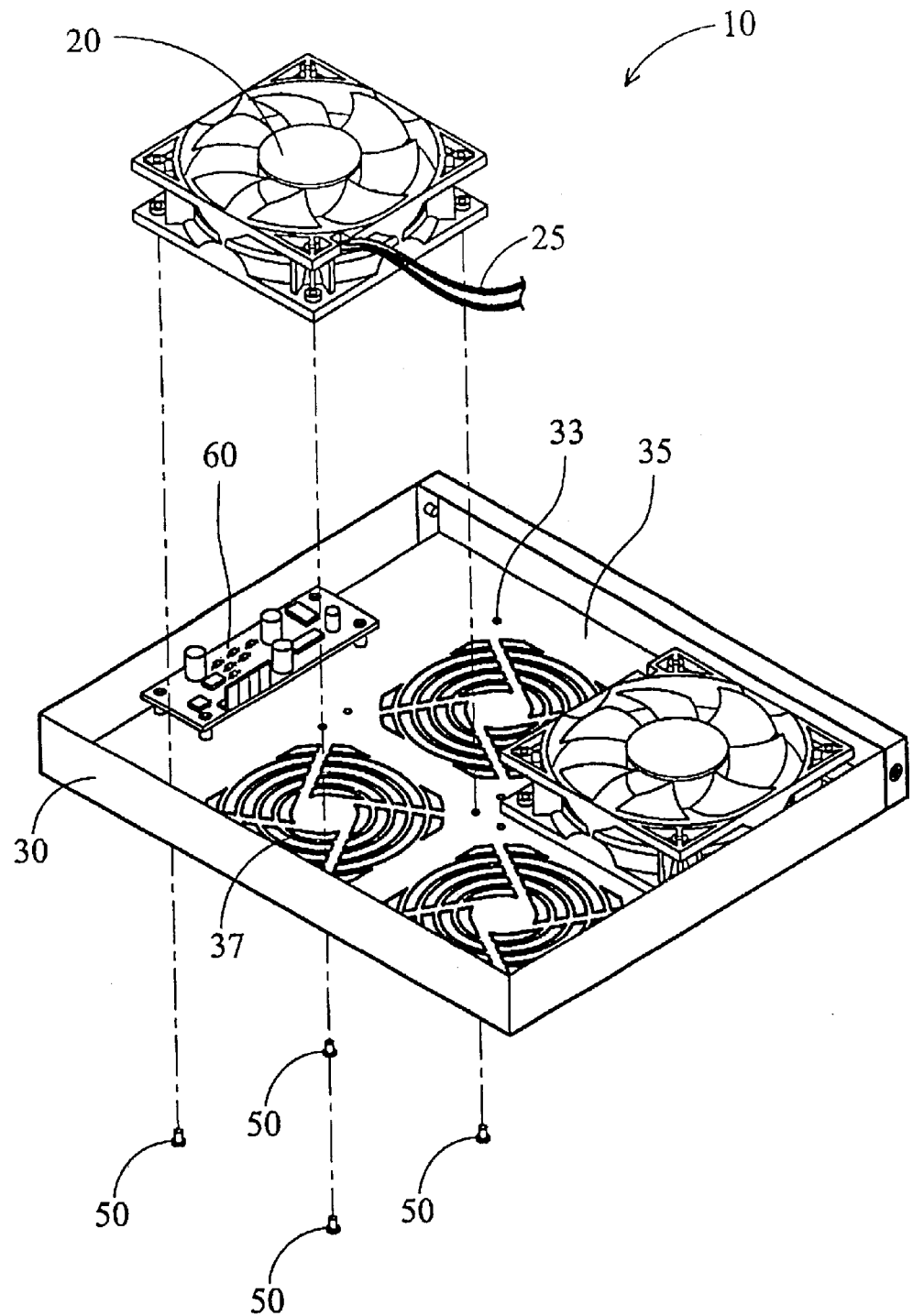
FIG. 1 depicts the conventional fan tray.
Figure 2:
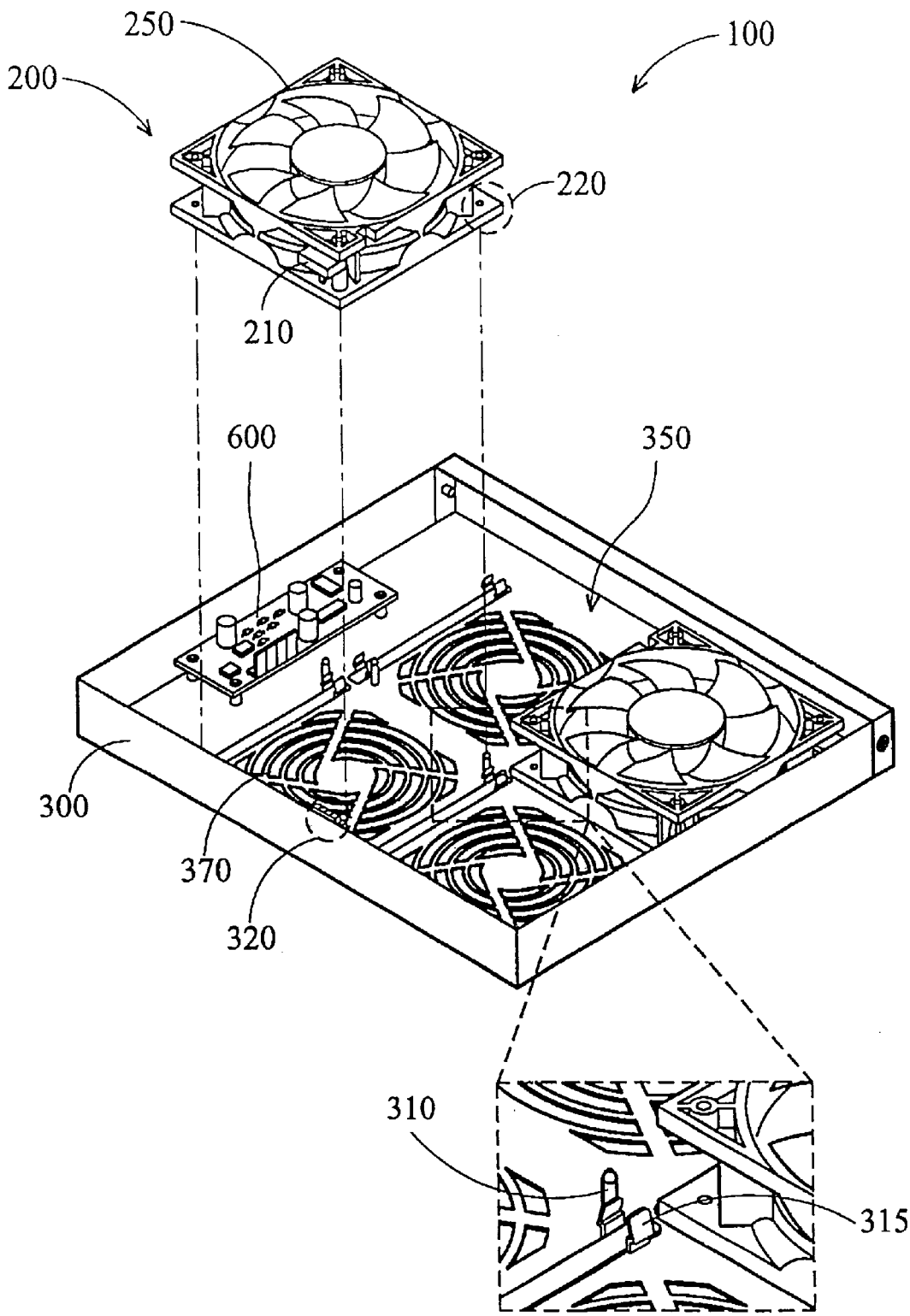
FIG. 2 depicts the fan tray according to the present invention.

As shown in FIG. 2, the present fan tray 100 includes at least one fan 200, a tray 300 and a controller 600. The fan 10 includes a first end 210 of the connector and an alignment hole 220 formed on the its frame 250. The first end 210 of the connector and the alignment hole 220 may be formed on, but not limited to, the side wall of the frame and the bottom of the frame, respectively. Note that according to the present invention, the fan already in existence may be combined with the first end 210 of the connector, thereby serving as the fan 200 and fully use of the source already in existence.

The tray 300 includes a bottom plate 350 and four side walls, and thus has the shape of an oblong box. The bottom plate 350 further includes a fan guard 370 formed thereon. In addition, the tray 300 includes at least one alignment post 310, at least one resilient fastener 315 and a second end 320 of the connector. Besides, the fan 200 electrically connects with the controller 600 by means of the first end 210 and the second end 320 of the connector. In this way the electrical wire (i.e. the signal and power line of the fan is hidden and the distribution of the electrical wire is simplified. Further, since the electrical wire is hidden, the distribution of the electrical wire is ordered. The controller 600 is used to activate and control the fan 200. For example, once some fan has a breakdown, the controller 600 starts the redundant fan or accelerates the speed of the remaining fans so as to compensate the decreased cooling ability.

Still referring to FIG. 2, the resilient fastener 315 may be a resilient hook 315 having the bend can be compressed in an appropriate amount. After the alignment post 310 slides into the alignment hole 220, the outer periphery of the frame 250 of the fan 200 compresses the bend. Then, the bend of the hook 315 turns to original shape due to resilience and thus fastens the fan. After that, the bend clamps the frame 250. In the preferred embodiment, the resilient fastener 315 is made of resilient steel. However, other suitable resilient metallic material can be substituted for the resilient steel.

As described above, the fan 200 is quickly aligned and coupled to the tray 300 by means of the alignment post 310 and the resilient fastener 315. That is, the present is capable of hot swap. In addition, electrical connection between the fan 200 and the controller 600 is established while the fan 200 is coupled to the tray 300.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A hot swap fan tray, comprising:
   a tray including at least one alignment post, at least one resilient fastener;
   a connector including a first end and a second end; and
   at least one fan including an alignment hole and mounted to said tray by said resilient fastener and aligning said alignment post to said alignment hole, wherein the first end of the connector is disposed on the tray and second end of the connector is disposed on one side of the fan, as the fan is mounted onto the tray, an electrical contact is formed from said first end to said second end to electrically connect the at least one fan to the tray by the connector.

2. The hot swap fan tray according to claim 1, wherein said fan further electrically connects with a controller by means of said first end and said second end of said connector.

3. The hot swap fan tray according to claim 2, wherein said controller activates said fan.

4. The hot swap fan tray according to claim 1, wherein said resilient fastener comprises a resilient hook.

5. The hot swap fan tray according to claim 1, wherein said resilient fastener is made of resilient steel.

* * * * *

UNITED STATES PATENT AND TRADEMARK OFFICE
CERTIFICATE OF CORRECTION

PATENT NO.    : 6,604,916 B2
DATED         : August 12, 2003
INVENTOR(S)   : Lu, Chow-Wen et al.

It is certified that error appears in the above-identified patent and that said Letters Patent is hereby corrected as shown below:

<u>Title page,</u>
Item [73], Assignee, change from "Deha Electronics, Inc." to -- Delta Electronics Inc. --

Signed and Sealed this

Tenth Day of February, 2004

JON W. DUDAS
*Acting Director of the United States Patent and Trademark Office*